US006489773B1

(12) United States Patent
Benco et al.

(10) Patent No.: US 6,489,773 B1
(45) Date of Patent: Dec. 3, 2002

(54) METHOD FOR SYNCHRONIZING TWO POWER SYSTEMS USING ANTICIPATION TECHNIQUE TO COMPENSATE FOR BREAKER CLOSING TIME

(75) Inventors: Joseph P. Benco, Germansville, PA (US); James P. Sagazio, Nazareth, PA (US)

(73) Assignee: ABB Inc., Norwalk, CT (US)

( * ) Notice: Subject to any disclaimer, the term of this patent is extended or adjusted under 35 U.S.C. 154(b) by 6 days.

(21) Appl. No.: 09/718,876

(22) Filed: Nov. 21, 2000

Related U.S. Application Data

(60) Provisional application No. 60/166,819, filed on Nov. 22, 1999.

(51) Int. Cl.$^{7}$ .................... G01R 31/02

(52) U.S. Cl. .................... 324/415

(58) Field of Search .................... 324/415; 361/71, 361/74, 75; 700/290

(56) References Cited

U.S. PATENT DOCUMENTS

| | | | | | |
|---|---|---|---|---|---|
| 3,599,007 | A | * | 8/1971 | Martin | 307/87 |
| 4,118,635 | A | * | 10/1978 | Barrett et al. | 290/40 R |
| 4,121,111 | A | * | 10/1978 | Crisafulli | 307/87 |
| 4,538,197 | A | * | 8/1985 | Breen | 361/71 |
| 4,672,555 | A | * | 6/1987 | Hart et al. | 364/483 |
| 5,578,923 | A | * | 11/1996 | Chen | 324/309 |
| 6,351,729 | B1 | * | 2/2002 | Thomson | 704/26 |

* cited by examiner

*Primary Examiner*—N. Le
*Assistant Examiner*—Etienne P. LeRoux
(74) *Attorney, Agent, or Firm*—Woodcock Washburn LLP

(57) ABSTRACT

A protective relay utilizes a mechanism that averages a buffer of anticipated optimal closing times to provide for a more accurate method of determining when to permit the issuance of a breaker close signal. This is used in a Breaker Close Time (BCT) feature of performing synchronism checking in the electrical power industry (for example, in a generator protection device).

22 Claims, 1 Drawing Sheet

METHOD FOR SYNCHRONIZING TWO POWER SYSTEMS USING ANTICIPATION TECHNIQUE TO COMPENSATE FOR BREAKER CLOSING TIME

CROSS REFERENCE TO RELATED APPLICATION

This application is entitled to and hereby claims the benefit of the filing date of U.S. Provisional Application Serial No. 60/166,819, filed on Nov. 22, 1999, entitled "Averaging Anticipation for Breaker Closing Time to Perform Sync Check," the disclosure of which is hereby incorporated by reference.

FIELD OF THE INVENTION

The present invention relates generally to the field of protective relaying, and more particularly to a "synch check" algorithm for determining when to close a circuit breaker.

BACKGROUND OF THE INVENTION

When both sides of an open circuit breaker are energized, caution must be taken so that, when the breaker closes, the two power systems can be tied together in a safe manner. This tying of power systems is called synchronization.

The synchronous check protective function measures the voltage magnitude, voltage phase angle, and power system frequency differences across an open circuit breaker. When all three of these parameters are within an acceptable level, the close command is issued, or permitted to be issued, in an attempt to close the circuit breaker. Circuit breakers do not close instantaneously. A typical breaker closing time is between 2 to 10 cycles (or 8–40 ¼-cycles). A goal of the present invention is to provide an improved algorithm for determining the optimal time to permit the breaker to close.

SUMMARY OF THE INVENTION

This invention utilizes a mechanism that averages a buffer of anticipated optimal closing times to provide for a more accurate method of determining when to issue a breaker close signal. This is used in a Breaker Close Time feature of performing synchronism checking in the electrical power industry (for example, in a generator protection device). Other features of the invention are described below.

BRIEF DESCRIPTION DRAWINGS

DETAILED DESCRIPTION OF PREFERRED EMBODIMENTS

Overview

Figure 1:
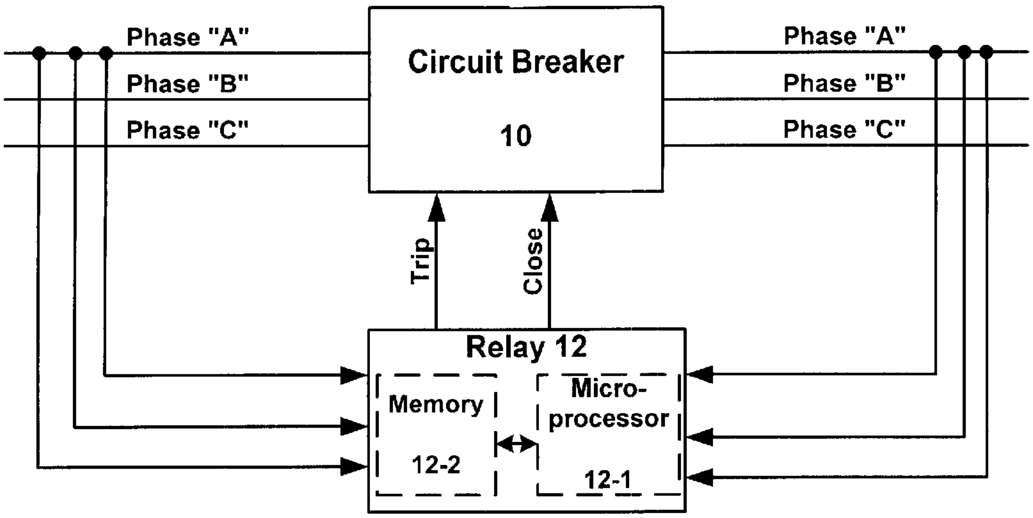
FIG. 1 illustrates a typical operating environment/system employing the present invention.

FIG. 1 depicts a protective relaying system employing the present invention. The illustrative system includes a circuit breaker 10 and a microprocessor or digital signal processor-based protective relay 12 including a processor 12-1 and a memory (or buffer) 12-2. As is well known in the art of protective relaying, the relay 12 includes analog-to-digital converters, filters, etc., for digitizing waveform samples obtained by current and voltage transformers associated with the phases of the transmission line (e.g., the "A", "B" and "C" phases of a three-phase transmission line). As shown, the relay 12 is operative to issue "Trip" and "Close" command signals to the circuit breaker 10. These signals cause the breaker to open (trip) or close.

The present invention may be employed, but is not limited to use, in a system of the kind described above and shown in FIG. 1. The invention provides an algorithm whereby the processor 12-1 is programmed to determine when two phasors across an open breaker are separated in time by an amount substantially equal to the predetermined amount of time ($t_{BCT}$) it would take for the breaker to close after receiving a close signal. This algorithm enables the issuance of an early "Close" command in anticipation of the breaker closing such that, when the breaker closes, the two phasors will be in substantial synchronization.

Figure 2:
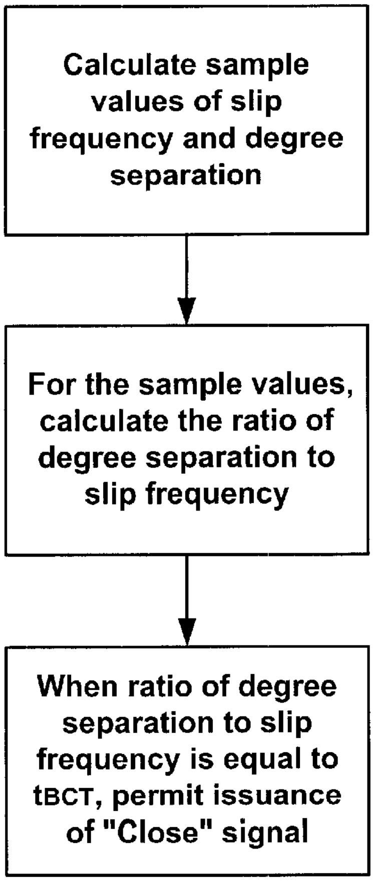
FIG. 2 is a flowchart of a method in accordance with the present invention.

The presently preferred implementation of the inventive algorithm is described in detail below. It may be summarized briefly as follows: (a) calculate a plurality of sample values of slip frequency (Δf) with units of degrees/x-cycle and degree separation (Δϕ) with units of degrees; (b) for the sample values, calculate the ratio of Δϕ/Δf; and (c) when the ratio of Δϕ/Δf is equal to $t_{BCT}$, permit a "Close" signal to the circuit breaker. The algorithm is also shown in the flowchart of FIG. 2. (Note that the minimum value of x is 1/n, where n is the number of samples per full period of the sampled sinusoidal voltage waveform at system frequency. For example, a ¼-cycle in which x=¼ refers to one-quarter of a full period of a sinusoidal wave at system frequency. In a 60 Hertz system a quarter-cycle takes up 4.167 ms.)

BCT Algorithm

The breaker closing time (BCT) algorithm of the present invention will detect when two voltage phasors across an open circuit breaker are "BCT" seconds apart and will issue an early close command in "anticipation" of the breaker closing. Thus, when the breaker finally does close, the two power systems will be in synchronization, or substantially the voltage phasors will be zero degrees out of phase. The time when the phasors are "BCT" seconds apart is referred to herein as "the optimal close time".

Two calculated parameters are used when detecting if two phasors across an open breaker are "BCT" time apart, slip frequency (Δf) with units of "degrees/(x -cycle)" and degree separation (Δϕ) with units of degrees.

These two parameters are effectively angular velocity and angular distance and can be related to time (x-cycle) by the ratio of Δϕ/Δf. Δf is computed by taking the difference of Δϕ[1]−Δϕ[0]. Δϕ[1] is the latest sample of Δϕ and Δϕ[0] is Δϕ x-cycle earlier. When the ratio of $\Delta\phi/\Delta f = t_{BCT}$, the synchronous check function permits issuance of a close signal (where $t_{BCT}$ represents the time required to close the breaker in units of x-cycles).

As the two phasors begin to move together an estimate of the number of x-cycles until the optimal close time is calculated at each x-cycle instant in time. The exact "x-cycle in the future" which is calculated to be the optimal close time can change from x-cycle to x-cycle. This can be due to errors from various sources such as actual variations (jitter) in slip frequency, noise on the analog input signals, noise from the analog sampling circuitry, quantization noise during sampling, and calculation "rounding" errors.

As the two phasors get closer together at each x-cycle, the relay calculates how many x-cycles exist until the optimal close time. To average out the variances of when the optimal close time will occur, a sliding window of anticipation values is maintained. This is slightly complicated because each x-cycle the number of x-cycles until the optimal close time naturally gets smaller. Therefore a straight average is not performed. Instead, each value in the sliding window is normalized. This is done by subtracting a number from it that is dependent on its position in the sliding window.

For example, if there are 8 values in the sliding window (once the buffer is saturated) and x=¼, the first sample, in units of ¼-cycles, is subtracted by 7. The second sample is subtracted by 6 and so on down to the $8^{th}$ sample being subtracted by zero.

After these subtractions have occurred a set of 8 values are generated. These 8 values are averaged together to provide the "Average anticipation until optimal close time" from the present moment in time.

During the subsequent ¼-cycle a $9^{th}$ sample is added to the buffer as the most recent sample and the oldest sample (sample 1) is discarded. The $9^{th}$ sample will be subtracted by zero, the $8^{th}$ sample subtracted by one, the $7^{th}$ sample subtracted by two, etc., down to the $2^{nd}$ sample being subtracted by 7. This cycle continuously repeats itself until the "Average anticipation until optimal close time" equals the BCT which indicated that the present ¼-cycle is the optimal close time and the close signal is issued.

This algorithm can work on any buffer depth. When performing a straight average using a number of samples that is an even power of 2 is optimal so that a bit manipulation (bit shift right by one bit) can be used as opposed to a long division. An example of this algorithm using a straight average of 8 samples is shown below.

For this description, let $t_n=(\Delta\phi/\Delta f)_n$, which is the number of ¼-cycles calculated during the nth ¼-cycle until the desired BCT will occur.

| ¼-cycle 1 | ¼-cycle 2 | ¼-cycle 3 |
|---|---|---|
| $A[0] = t_0 - 7$ | $A[0] = t_8 - 0$ | $A[0] = t_8 - 1$ |
| $A[1] = t_1 - 6$ | $A[1] = t_1 - 7$ | $A[1] = t_9 - 0$ |
| $A[2] = t_2 - 5$ | $A[2] = t_2 - 6$ | $A[2] = t_2 - 7$ |
| . | . | . |
| . | . | . |
| . | . | . |
| $A[7] = t_7 - 0$ | $A[7] = t_7 - 1$ | $A[7] = t_7 - 2$ |

Ax=(A[0]+A[1]+. . . +A[7])/8, where Ax=Average Anticipation for ¼-cycle x.

Other types of averages could also be employed to account for other scenarios. An example is a weighted average. If the "jitter" in the calculated close time is deemed to be caused by noise in the system then a straight average is better. If the jitter is deemed to be caused more from actual variances in the slip frequency then a weighted average is better. The reasoning is that if the frequency is actually changing then the most recent measurements are better representations of the situation at that moment and therefore their value should be given more consideration than previous estimates. An example of one method for performing a weighted average is as follows:Ax=(0.5*A[7])+(0.25*A[6])+(0.125*A[5])+. . . +(0.0078125*A[1])+(0.0078125*A[0]) This assumes that A[7] is the most recent sample acquired and that A[0] is the oldest sample acquired. In this case the most recent sample gets half the weight, and each successive sample gets half as much weight. Note: the last two samples must have equal weight so that all of the weights add up to 1.0.

The present invention is not intended to be limited to the presently preferred embodiments described above. The scope of protection of the following claims is intended to be sufficient to cover obvious variations and modifications of the preferred embodiments.

We claim:

1. A method for determining when two or more voltage phasors across an open circuit breaker are separated in phase by an amount substantially corresponding to the predetermined amount of time ($t_{BCT}$) it would take for the breaker to close after receiving a close command, thus enabling the issuance of a close command in anticipation of the breaker closing such that, when the breaker closes, the two or more voltage phasors will be in substantial synchronization, comprising:

(a) determining a plurality of sample values of slip frequency ($\Delta f$) with units of degrees/x-cycle and degree separation ($\Delta\phi$) with units of degrees, wherein x is a predetermined number;

(b) for the sample values, determining the ratio of $\Delta\phi/\Delta f$; and (c) when the ratio of $\Delta\phi/\Delta f=t_{BCT}$, issuing a close signal to the circuit breaker.

2. A method as recited in claim 1, wherein, as the two voltage phasors move together, an estimate of the number of x-cycles until an optimal close time is calculated at each x-cycle instant in time.

3. A method as recited in claim 2, wherein a sliding window of anticipation values is maintained to average out variances of when the optimal close time will occur.

4. A method as recited in claim 3, wherein the number of x-cycles remaining until the optimal close time naturally decreases at each x-cycle relative to the previous x-cycle, and, to adjust for this, sample values of $\Delta\phi/\Delta f$ are normalized.

5. A method as recited in claim 4, wherein the normalization is done by subtracting a number from each sample that is dependent on the age of the sample value.

6. A method as recited in claim 5, wherein a sliding window of a predefined number (N) of sample values is maintained in a memory.

7. A method as recited in claim 6, wherein the normalization is carried out by subtracting N-1 from the oldest sample value in the sliding window, subtracting N-2 from the second-oldest sample value, and so on, such that the newest sample value is subtracted by zero.

8. A method as recited in claim 6, wherein, after normalization, the N sample values of $\Delta\phi/\Delta f$ are averaged to provide an average anticipation until optimal close time.

9. A method as recited in claim 8, wherein the average is a weighted average.

10. A method as recited in claim 6, wherein x is in the range of $$\frac{1}{n} \le x \le 1,$$

and n is the number of samples per period of system frequency of the sampled signal.

11. A method as recited in claim 10, wherein x=¼.

12. A protective relay comprising transformers for monitoring current and/or voltage waveforms on either side of a circuit breaker, analog-to-digital converters for digitizing samples of the waveforms, a programmable processor, and a memory coupled to the processor, wherein the processor is programmed to determine when two voltage phasors across an open breaker are separated in phase by an amount substantially corresponding to the predetermined amount of time ($t_{BCT}$) it would take for the breaker to close after receiving a close signal, thus enabling the issuance of a close command in anticipation of the breaker closing such that, when the breaker closes, the two voltage phasors will be in substantial synchronization, wherein the processor is programmed to perform the following steps: (a) calculate a plurality of sample values of slip frequency (Δf) with units of degrees/x -cycle and degree separation (Δϕ) with units of degrees; (b) for the sample values, calculate a ratio of Δϕ/Δf; and (c) permit the issuance of a close signal to the circuit breaker when the ratio of Δϕ/Δf exhibits a prescribed relationship with $t_{BCT}$.

13. A protective relay as recited in claim 12, wherein, as the two voltage phasors move together, an estimate of the number of x-cycles until an optimal close time is calculated at each x-cycle instant in time.

14. A protective relay as recited in claim 13, wherein a sliding window of anticipation values is maintained to average out variances of when the optimal close time will occur.

15. A protective relay as recited in claim 14, wherein the number of x-cycles remaining until the optimal close time naturally decreases at each x-cycle relative to the previous x-cycle, and, to adjust for this, sample values of Δϕ/Δf are normalized.

16. A protective relay as recited in claim 15, wherein the normalization is done by subtracting a number from each sample that is dependent on the age of the sample value.

17. A protective relay as recited in claim 16, wherein a sliding window of a predefined number (N) of sample values is maintained in a memory.

18. A protective relay as recited in claim 17, wherein the normalization is carried out by subtracting N- I from the oldest sample value in the sliding window, subtracting N-2 from the second-oldest sample value, and so on, such that the newest sample value is subtracted by zero.

19. A protective relay as recited in claim 17, wherein, after normalization, the N sample values of Δϕ/Δf are averaged to provide an average anticipation until optimal close time.

20. A protective relay as recited in claim 19, wherein the average is a weighted average.

21. A protective relay as recited in claim 17, wherein x is in the range of $$\frac{1}{n} \leq x \leq 1,$$

and n is the number of samples per period of system frequency of the sampled signal.

22. A protective relay as recited in claim 21, wherein x=¼.

* * * * *

UNITED STATES PATENT AND TRADEMARK OFFICE

CERTIFICATE OF CORRECTION

PATENT NO. : 6,489,773 B1
DATED : December 3, 2002
INVENTOR(S) : Joseph P. Benco et al.

It is certified that error appears in the above-identified patent and that said Letters Patent is hereby corrected as shown below:

Column 6,
Line 2, delete "N- I" and insert -- N-1 -- therefor.

Signed and Sealed this

Eighth Day of July, 2003

JAMES E. ROGAN
*Director of the United States Patent and Trademark Office*